United States Patent
Moses et al.

(10) Patent No.: US 8,416,019 B2
(45) Date of Patent: *Apr. 9, 2013

(54) SYSTEM AND METHOD FOR INTERPOLATING DIGITALLY-CONTROLLED AMPLIFIER GAIN

(75) Inventors: Robert W. Moses, Vashon Island, WA (US); Leslie B. Tyler, Milford, MA (US); Christopher Hanna, Arlington, MA (US)

(73) Assignee: THAT Corporation, Milford, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/857,163

(22) Filed: Aug. 16, 2010

(65) Prior Publication Data
US 2011/0068867 A1    Mar. 24, 2011

Related U.S. Application Data

(60) Provisional application No. 61/234,056, filed on Aug. 14, 2009.

(51) Int. Cl.
*H03G 3/20* (2006.01)
(52) U.S. Cl. .................... 330/131; 330/137
(58) Field of Classification Search .......... 330/131, 330/278, 280, 254, 141; 375/345
See application file for complete search history.

(56) References Cited

U.S. PATENT DOCUMENTS 6,122,331 A * 9/2000 Dumas .................... 375/345
6,324,229 B1   11/2001 Browder

FOREIGN PATENT DOCUMENTS

GB    2436178    9/2007

OTHER PUBLICATIONS

International Search Report and the Written Opinion from corresponding PCT Application No. PCT/US10/045644 dated Nov. 12, 2010.

* cited by examiner

*Primary Examiner* — Hieu Nguyen
(74) *Attorney, Agent, or Firm* — McDermott Will & Emery LLP

(57) ABSTRACT

A digitally-controlled analog gain circuit supports a plurality of gain settings in which gain changes are made from a first setting to a new setting in response to a clocking signal. Large changes in gain are interpolated in small gain steps or increments. The clocking signal can be generated by an oscillator, or as a sequence of pulses output by a zero crossing detector. The gain circuit can apply positive gain to the signal. Alternatively, the gain circuit can apply a negative gain (attenuation) to the signal. The clocking signal can be provided in a pseudo-randomized manner to minimize unwanted signal effects such as discernable sound transients.

28 Claims, 6 Drawing Sheets

(A)

(B)

Events
1. [NewG]: New Gain value loaded
2. [MinTO]: Minimum time out
3. [MaxTO]: Maximum time out
4. [ZC]: Zero crossing Actions:
1. [Idle]
2. [RstTO]: Reset time out
3. [SetG]: Set gain to new value

SYSTEM AND METHOD FOR INTERPOLATING DIGITALLY-CONTROLLED AMPLIFIER GAIN

CROSS-REFERENCE TO RELATED APPLICATIONS

This application is based upon and claims priority to Applicant's co-owned U.S. Provisional Patent Application No. 61/234,056, entitled "System and Method for Interpolating Digitally-Controlled Amplifier Gain," filed Aug. 14, 2009 in the name of Robert W. Moses and Christopher M. Hanna.

This application is also related to Applicant's co-owned pending U.S. patent application Ser. No. 12/857,099, contemporaneously filed with the present application in the name of Gary K. Hebert, entitled "Area Efficient Programmable-Gain Amplifier," which claims priority to U.S. Provisional Application No. 61/234,031 filed Aug. 14, 2009 in the name of Gary K. Hebert and entitled "Area Efficient Programmable-Gain Amplifier".

This application is also related to Applicant's co-owned pending U.S. patent application Ser. No. 12/857,074, contemporaneously filed with the present application in the name of Gary K. Hebert, entitled "Dynamic Switch Driver for Low Distortion Programmable Gain Amplifier," which claims priority to U.S. Provisional Application No. 61/234,039 filed Aug. 14, 2009 in the name of Gary K. Hebert and entitled "Dynamic Switch Driver for Low Distortion Programmable Gain Amplifier".

This application is also related to Applicant's co-owned pending U.S. patent application Ser. No. 12/857,246 contemporaneously filed with the present application in the name of Robert Moses and entitled "System and Method for Digital Control of Amplifier Gain with Reduced Zipper Noise", which claims priority to U.S. Provisional Patent Application No. 61/234,046, entitled "System and Method for Digital Control of Amplifier Gain with Reduced Zipper Noise," filed Aug. 14, 2009 in the name of Robert Moses.

The entire content of the above-noted applications is incorporated herein by reference.

BACKGROUND

Switching transients can occur in digitally controlled analog gain applications. The transients can occur when a near-instantaneous gain change is made to an analog signal, causing a discontinuity in the signal. The discontinuity can take many forms, including the step-function discontinuity of the signal itself as the gain is suddenly changed from one level to another, as well as the small glitch added to the signal due to charge injection in FET-based switches. Both these forms can be exacerbated by overshoot and/or ringing in the analog circuitry. These switching transients are unacceptable in high quality audio circuits.

Prior art, such as the Texas Instruments PGA2500 Programmable Gain Amplifier can execute near instantaneous changes to gain. Control software in a host microcontroller typically interpolates small gain steps (e.g., 1 dB) between large gain setting changes (e.g., 40 dB) by sending a sequence of gain change commands. This sequence of commands is executed in an iterative software loop or timer-based interrupt service routine, requiring significant software overhead. In systems with many audio channels, e.g., mixing consoles with 32 or more input channels, the host microcontroller must send thousands of updates per second to ramp all channels, which consumes significant software resources and results in a tremendous load on the control bus.

Similar to the Texas Instruments PGA2500, a variety of "digitally-controlled volume control" ICs are available from multiple vendors with switched resistor ladder attenuators. The first of these was the Cirrus CS3310, introduced in 1991. Like the PGA2500, the CS3310 allows gain (attenuation) changes to be restricted to zero-crossings, but it lacks the internal intelligence to ramp large gain changes without significant burden to microcontroller hardware/software.

U.S. Pat. No. 5,596,651 (the "'651 patent") teaches a method of ramping gain changes with a multiplying DAC, which is inherently an attenuator. The '651 patent specifies that the clock, which paces ramping, must have a predetermined frequency. The '651 patent does not allow gain changes to be constrained to zero-crossings. Therefore, even though gain changes are ramped in small steps, these changes can occur during audio signal peaks resulting in audible transients, which are unacceptable in high quality audio circuits.

U.S. Pat. No. 6,405,093 (the "'093 patent") describes a method for making gain changes on zero crossings. The '093 patent does not teach a method of interpolating gain steps. The '093 patent describes a method in the steps of enabling a zero crossing detector by a comparator when the initial gain value and new gain value do not match, and disabling the zero crossing detector when they do match. Like previous techniques, such operation can result in audible transients.

SUMMARY

Aspects and embodiments of the present disclosure address the problems noted previously.

An aspect of the present disclosure is directed to systems and methods that reduce the audibility of switching transients by interpolating small gain steps during large gain changes.

A further aspect of the present disclosure includes restricting gain changes to occur only during signal zero crossings so that discontinuities are minimized. Embodiments of the present disclosure provide for interpolating (ramping) gain changes on a sequence of zero crossings of an analog signal.

A further aspect of the present disclosure includes providing increments (interpolated steps) of gain change according to non-uniform (or pseudo-random) time increments.

In exemplary embodiments, by implementing this functionality internally in an audio preamplifier integrated circuit (IC), the burden on microcontroller control hardware/software can be reduced or eliminated.

These, as well as other components, steps, features, benefits, and advantages, will now become clear from a review of the following detailed description of illustrative embodiments, the accompanying drawings, and the claims.

BRIEF DESCRIPTION OF DRAWINGS

The drawings disclose illustrative embodiments. They do not set forth all embodiments. Other embodiments may be used in addition or instead. Details which may be apparent or unnecessary may be omitted to save space or for more effective illustration. Conversely, some embodiments may be practiced without all of the details which are disclosed. When the same numeral appears in different drawings, it refers to the same or like components or steps.

Figure 1:
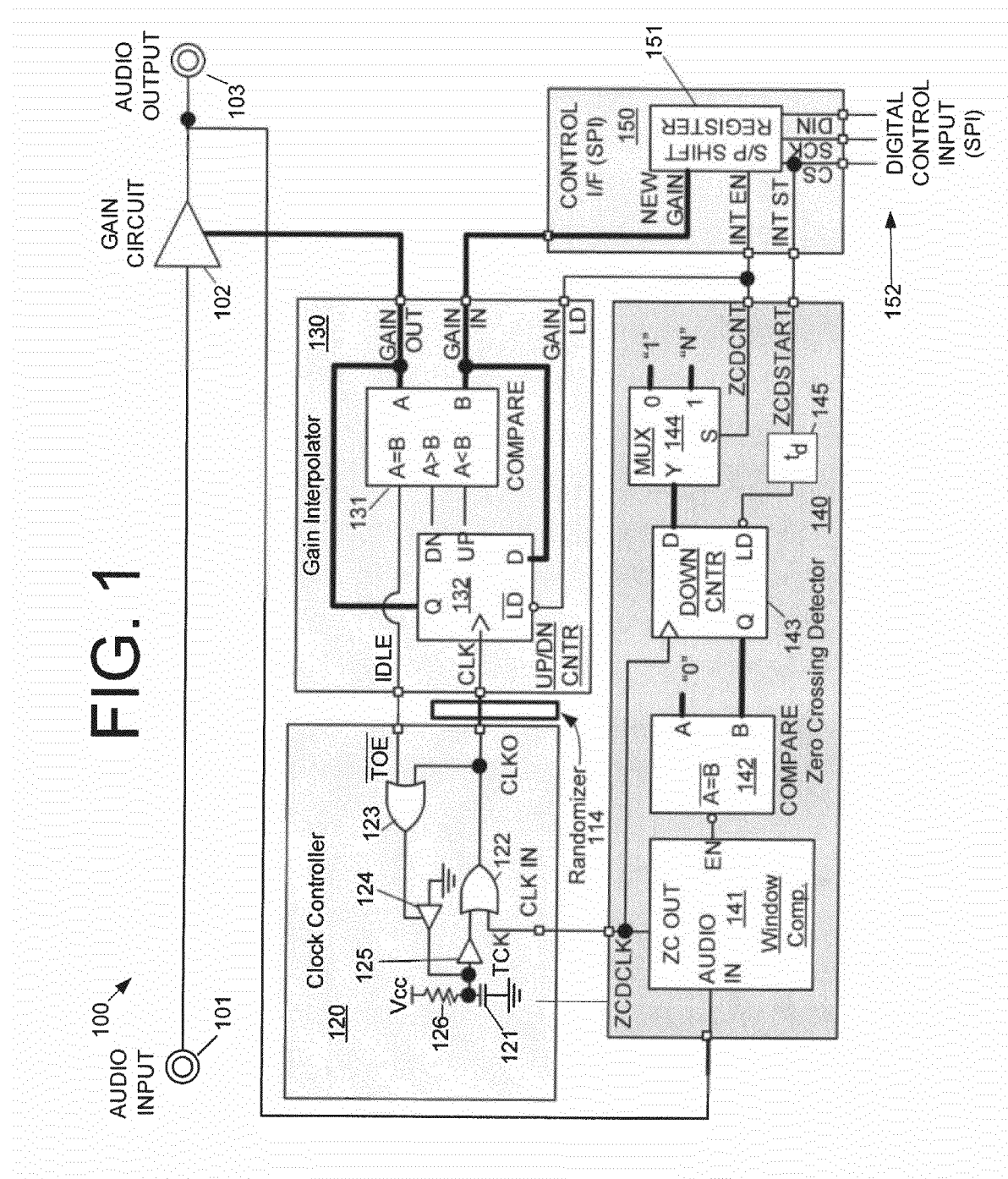
FIG. 1 depicts a block diagram of a system and method for interpolating digitally-controlled amplifier gain, in accordance with exemplary embodiments of the present disclosure.

While certain embodiments depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION

Illustrative embodiments are now discussed. Other embodiments may be used in addition or instead. Details which, may be apparent or unnecessary may be omitted to save space or for a more effective presentation. Conversely, some embodiments may be practiced without all of the details which are disclosed.

FIG. 1 depicts an exemplary embodiment of a gain control system 100 constructed to interpolate a digitally-controlled amplifier gain, in accordance with exemplary embodiments of the present disclosure. System 10 includes Audio Input 101 coupled to the input of Digitally Controllable Gain Circuit 102 (amplification or attenuation), which in turn is coupled to Audio Output 103. The gain of Gain Circuit 102 is controlled by a feedback circuit comprising Zero Crossing Detector 140. Detector 140 emitting a pulse when the Audio Output signal is near a zero crossing. The Zero Crossing Detector 140 provides an output to the gain interpolator 130, which in turn provides the gain setting to the Gain Circuit 102. Clock Controller 120 provides a clock signal to the Gain Interpolator 130 so that Gain Interpolator 130 can compute intermediate gain steps between an initial value and a new value and apply the new values to the Digitally Controlled Gain Circuit 102. Control Interface 150 with serial port 152, provides control of the system from a host microcontroller (not shown).

Figure 2:
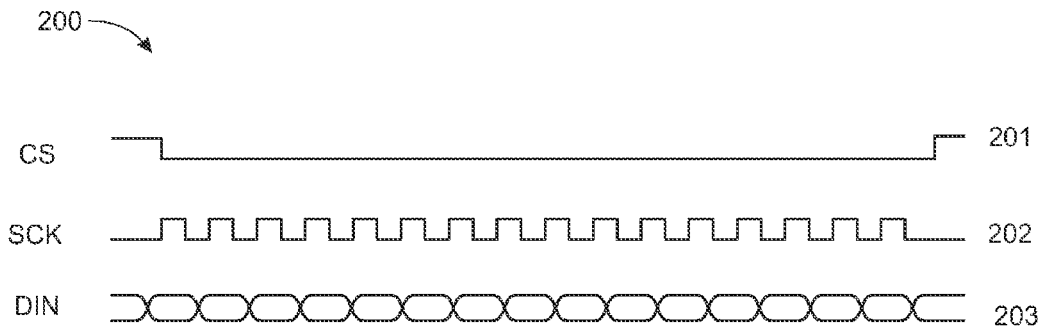
FIG. 2 shows a timing diagram of the serial port shown in FIG. 1.

FIG. 2 shows a timing diagram 200 for serial port 152 shown in FIG. 1. In FIG. 2, CS 201 represents a Chip Select signal, SCK 202 represents a serial clock signal, and DIN represents data received from the DIN input of serial port 152.

Referring to FIGS. 1-2, in operation of system 100 an audio signal is provided at the Audio Input 101, gain is applied by Gain Circuit 102, and the resultant audio is provided at the Audio Output 103. The gain of Gain Circuit 102 is set by the Gain Interpolator 130, a binary up/down counter that counts between an initial value ("old gain") and a new value ("new gain") on each clock cycle from the Clock Controller 120. Clock Controller 120 either passes through zero crossing pulses from Zero Crossing Detector 140 or a time-out pulse if no zero crossing is detected within a specified time period. The Zero Crossing Detector 140 is enabled to detect one zero crossing if the Gain Interpolator 130 is disabled (in which case the new gain value is simply loaded to the Gain Interpolator 130 output on the next clock), or a finite number of zero crossings (N) if the Gain Interpolator 130 is enabled.

Detailed Operation

Idle State

With continued reference to FIG. 1, during an idle state, Gain Out (A) on Gain Interpolator 130 is equal to Gain In (B) from Control Interface 150. The Clock Controller 120 time out function and Zero Crossing Detector 140 are disabled; therefore, no clocks are output to the Gain Interpolator 130. This idle state continues until a new gain is loaded into Control Interface 150.

Operation of the Control Interface

In exemplary embodiments, as shown in FIG. 1, the Control Interface 150, which can include a Serial Peripheral Interface (SPI), operates as follows. Serial data is loaded into Serial Port 152, e.g., with timing shown in FIG. 2, described in further detail below. The data received from the DIN input can be provided to a double-buffered serial to parallel shift register 151. This data can include at least two bit fields: a single bit which enables the interpolator (INT_EN); and a binary representation of the new gain value to be forwarded to the Gain Circuit 102 via the Gain Interpolator 130. Data is clocked into the first (or, input) buffer of parallel shift register 151 via the Serial Port 152 on rising edges of the serial clock signal (SCK), e.g., 202 in FIG. 2, and latched into the output (or, second) buffer of 151 on the rising edge of Chip Select (CS) 201 shown in FIG. 2. This rising edge of CS is also connected to the Zero Crossing Detector Start (ZCDSTART) pin of the Zero Crossing Detector 140, which initiates its operation.

Operation of the Zero Crossing Detector

The Zero Crossing Detector 140 can be configured to either detect one zero crossing (e.g., when the Gain Interpolator 130 is disabled), or a greater number of zero crossings, N, (e.g., 63) when Gain Interpolator 130 is enabled by loading a count value from multiplexer (MUX) 144 into down counter 143. The Select (S) input of MUX 144 is controlled by the Zero Crossing Detector Count (ZCDCNT) input, which is connected to the Interpolator Enable (INT_EN) control bit output by Control interface 150. Because of this configuration, when INT_EN=0, the MUX 144 selects a count of 1 (Gain Interpolator 130 is disabled). When INT_EN=1, the MUX 144 selects "N" (Gain Interpolator 130 is enabled). The Zero Crossing count ("1" or "N") output by MUX 144 is loaded into a binary down counter 143 while its LD input is low. The LD signal is a delayed version of the Serial Port 152 Chip Select (CS) signal (201 in FIG. 2), which makes a low to high transition after new data has been loaded into the Control Interface 150 shift register 151. Time Delay 145 ensures that the down counter 143 LD input remains low long enough for the Interpolator Enable (INT_EN) INT_EN bit output by the double-buffered shift register 151 to arrive at the Select (S) input of MUX 144, and for MUX 144 to subsequently output the count value to the down counter 143 data input (D), before the LD signal goes high.

As shown in FIG. 1, the output of the down counter 143 is applied to comparator 142 which compares it to "0". The Comparator 142 "A=B" output is asserted low if its "A" and "B" inputs are equal, and high if its inputs are unequal. The Comparator 142 output is connected to the Window Comparator 141 Enable (EN) input. Therefore, the Window Comparator 141 is enabled while the down counter 143 output is non-zero.

When enabled, the Window Comparator 141 outputs a logic high while its audio input is near zero (e.g., within 5 mV) and a logic low while its audio input is not near zero. The down counter 143 is clocked by positive edges on pulses output by Window Comparator 141. Thus, the Zero Crossing Detector 140 outputs zero crossing pulses until the down counter 143 counts down to 0, and it is then disabled.

The number of zero crossings specified when the Gain Interpolator 130 is enabled is typically equal to the highest number of possible steps the Gain Interpolator 130 could possibly make (e.g., 63 in exemplary embodiments), thus ensuring that the Gain Interpolator 130 can complete its sequence of steps, but no more zero crossings are enabled than necessary. It may be desirable to restrict the Zero Crossing Detector to operate for the shortest possible time period because it can emit noise into the audio signal path.

Operation of the Gain Interpolator

As shown in FIG. 1, Gain Interpolator 130 inputs a new gain value from Control Interface 150 and "ramps" to it from its current state on clocks received from Clock Controller 120. The output of the Gain Interpolator 130 is applied to the gain digital control port of Gain Circuit 102.

At the heart of the Gain Interpolator 130 is a binary up/down counter 132 which counts up when its "UP" input is logic high, or counts down when its "DN" input is logic high. The up/down counter 132 loads the data input (D) directly to its output (Q) when a clock occurs while the active-low "LD" input is low. The LD input is connected to the INT_EN bit output by the Control Interface 150, thus, the new gain value is loaded directly to the Gain Interpolator 130 output Q when ramping is disabled. The output of the up/down counter 132 is the new gain setting applied to the Gain Circuit 102. The up/down counter 132 UP and DN inputs are received from a Comparator 131 which compares the new gain received on the GainIn port to the current gain output by the up/down counter 132. Comparator 131 outputs a logic high on the "A=B", "A<B", or "A>B" outputs based on the values input on it's "A" and "B" inputs. Thus, the up/down counter 132 counts (interpolation occurs) until its output is equal to the new gain value received from the Control Interface 150, and then it stops.

The "A=B" output of Comparator 131 is output to the Clock Controller 120 as an indication of whether the interpolation function is active or idle (logic low=active, logic high=idle). This enables the time out function of the Clock Controller 120 so that clock pulses can be sent to the up/down counter 132 in the absence of pulses from Zero Crossing Detector 140.

Operation of the Clock Controller

With continued reference to FIG. 1, the Clock Controller 120 receives and passes through pulses from Zero Crossing Detector 140, and produces a "time out" clock pulse if no zero crossing pulse is received within a specified time window. This can ensure that the Gain Interpolator 130 steps through its gain steps with or without zero crossing pulses. Indeed, the time out function can serve as an "internal clock generator" if the zero crossing function is disabled or in the absence of an audio signal. An optional a clock randomizer 114 can be present, as described in further detail below for FIGS. 7-8.

Zero crossing pulses are received on the Clock Controller 120 clock input (CLKIN) and applied to a first input of a two-input logic OR gate 122. If the second input of OR gate 122 is low, OR gate 122 passes through zero crossing pulses received from Zero Crossing Detector 140 to Gain Interpolator 130. The second input of OR gate 122 is fed by a buffer 125 which has its input connected to a capacitor 121 that is charged through a resistor 126. In its initial uncharged state, capacitor 121 holds the input of buffer 125 near 0 volts, and consequently buffer 125 outputs a logic low. When capacitor 121 charges to a voltage equal to the minimum high input voltage threshold of buffer 125, the buffer outputs a logic high. Tristate buffer 124 quickly discharges capacitor 121 when its enable port is high.

The enable port of tristate buffer 124 is controlled by the output of another two-input OR gate 123. OR gate 123 inputs are connected to the Time Out Enable (TOE) and Clock Out (CLKO) signals. The active low TOE signal is asserted high while the Gain Interpolator 130 is inactive, thus, capacitor 121 is prevented from charging while the Gain Interpolator is inactive, effectively disabling the time out function because capacitor 121 can never charge up. When the TOE signal is low (Gain Interpolator 130 is active), the output of OR gate 123 follows the CLKO input. Thus, each time a low to high transition occurs on CLKO, capacitor 121 is discharged and the time out function is reset. If a zero crossing is received on the CLKIN port before capacitor 121 charges, it is passed through the CLKO port and the time out is reset. If no zero crossing is received on the CLKIN port before capacitor 121 charges, the time out forces a low to high transition on CLKO, which then forces capacitor 121 to be discharged, resulting in a short time out clock pulse on CLKO. Thus, the Clock Controller 120 ensures that either zero crossing pulses (when Zero Crossing Detector 140 is active) or time out pulses (when TOE is enabled) are output to Gain Controller 130.

Figure 3:
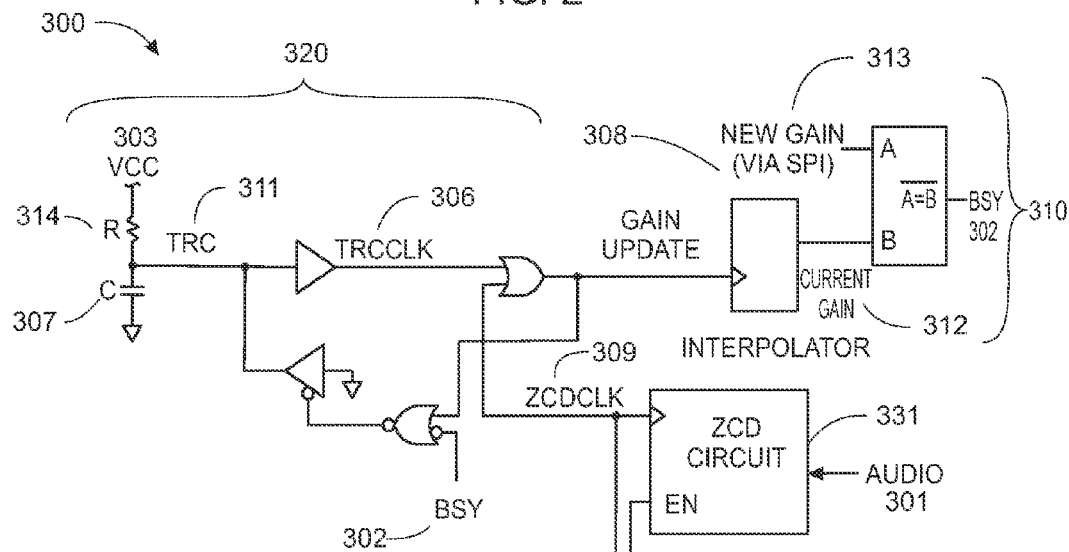
FIG. 3 depicts another system for interpolating digitally-controlled amplifier gain, in accordance with exemplary embodiments of the present disclosure.
Figure 3:
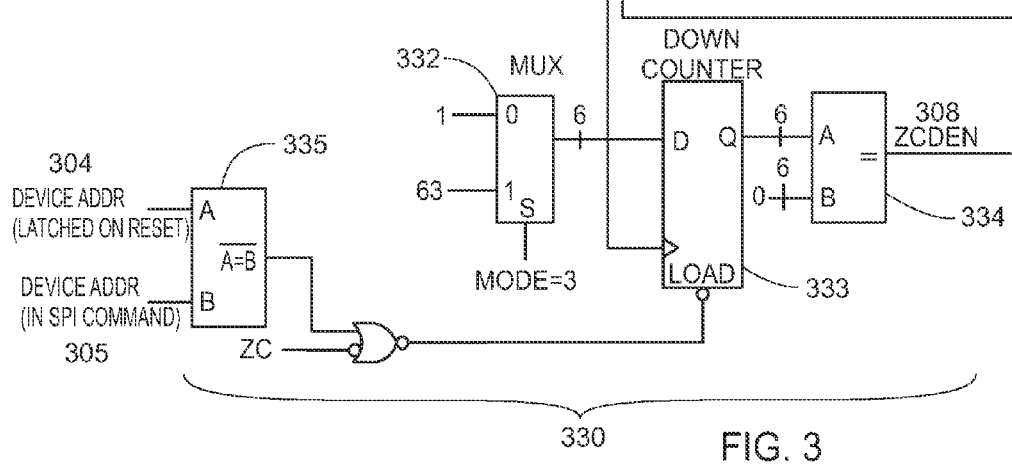

FIG. 3 depicts a circuit diagram of another gain control system 300, in accordance with exemplary embodiments of the present disclosure. Similar to system 100 of FIG. 1, system 300 includes a gain interpolator 310, a clock controller 320, and a zero crossing detector 330 (the control I/F is indicated by SPI 308). Audio signal input 301, Vcc 303, and BSY signals are indicated.

Clock controller 320 receives the BSY signal 302 and the ZCDCLK signal 309, and produces the TRC signal 311 and the TRCCLK signal 306 to provide a GAIN UPDATE signal to the gain interpolator 310. Clock controller 320 can include a tri-state buffer, a second buffer, an OR gate, and a NOR gate as shown.

With continued reference to FIG. 3, zero crossing detector 330 includes a ZCD circuit 331, a multiplexor 332, down counter 333, and comparators 334-335. Device addresses 304-305 are input to comparator 335.

Figure 4:
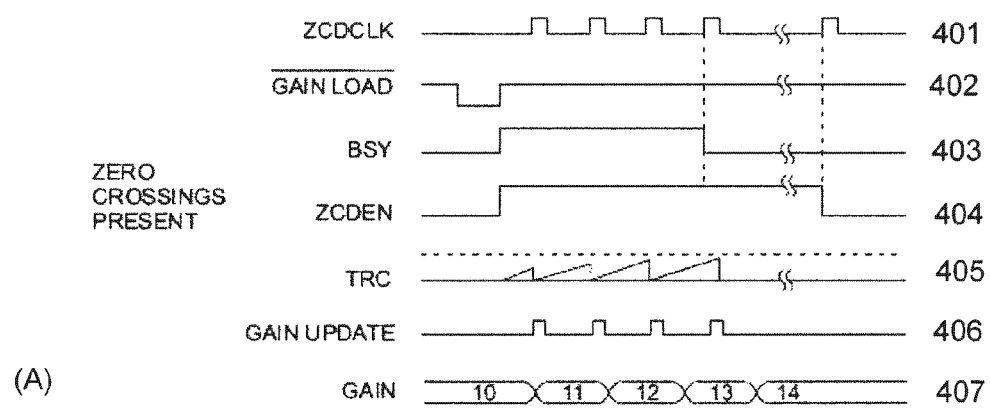
FIG. 4 depicts two timing diagrams for the system of FIG. 3 in two different operational conditions.
Figure 4:
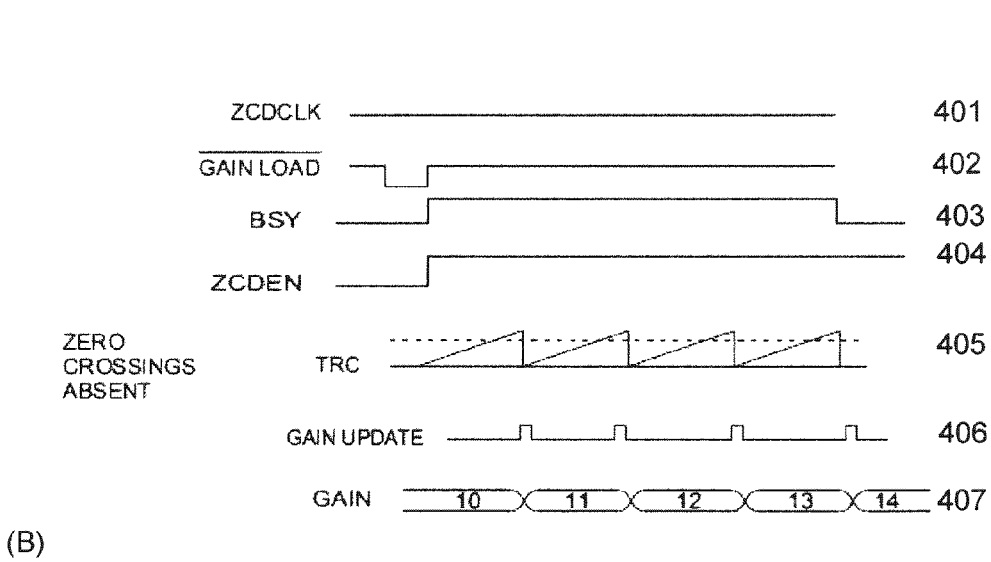

FIG. 4 depicts two timing diagrams, A and B, related to system 300 of FIG. 3 for two different operational cases.

For the first case depicted in FIG. 4A, audio zero crossings are detected (ZCDCLK 309 has active pulses). In this case, gain updates take place on zero crossings. This condition can be summarized as follows: BSY 302 is low, keeping the TRC capacitor 307 discharged. ZCDEN 308 is low disabling the ZCD circuit (holds ZCDCLK inactive low). Rising edge of GAIN LOAD latches a NEW GAIN value, sets BSY and ZCDEN active high. Since audio zero crossings are detected ZCDCLK has active pulses, TRC capacitor is discharged by these pulses, GAIN updates take place on ZCDCLK pulses. BSY 302 goes low when CURRENT GAIN has ramped (or, moved from one value to another via discrete steps) to NEW GAIN. ZCDEN goes low when the downcounter reaches zero (e.g., 63 ZCDCLK pulses).

For the second case shown in FIG. 4B, audio zero crossings are not detected (ZCDCLK 309 has no active pulses) In this case gain updates take place on TRC signal timeout. BSY 302 is low in this case, keeping the TRC capacitor discharged. When ZCDEN 308 is low, the ZCD circuit becomes disabled (holds ZCDCLK inactive or low). The Rising edge of GAIN LOAD latches a NEW GAIN value, sets BSY 302 and ZCDEN 308 active (high). Since audio zero crossings are not detected ZCDCLK 309 is inactive, so TRC capacitor 307 is charged and discharged, GAIN updates take place on time- RC (TRCCLK) pulses 311 (as set by the resistor 314 and capacitor 307). The BSY 302 signal goes low when CURRENT GAIN 312 has ramped (changed) to the NEW GAIN 313 value. ZCDEN 308 remains high since there are no ZCD-CLK pulses.

Embodiments according to FIGS. 1-4 can effectively interpolate gain steps as described, but may in some circumstances suffer from a minor flaw. Zero crossing pulses which serve as a clock for a gain interpolator, e.g., Gain Interpolator 130 of FIG. 1, can occur at a high frequency in the presence of a high frequency (e.g. 20 kHz) audio signal. Such a high frequency clock can cause the gain interpolator to make rapid gain changes, thereby compromising the benefits of a slowly ramped gain change. In exemplary embodiment, described below, a means for introducing a minimal time out before each zero crossing is accepted overcomes this problem.

Figure 5:
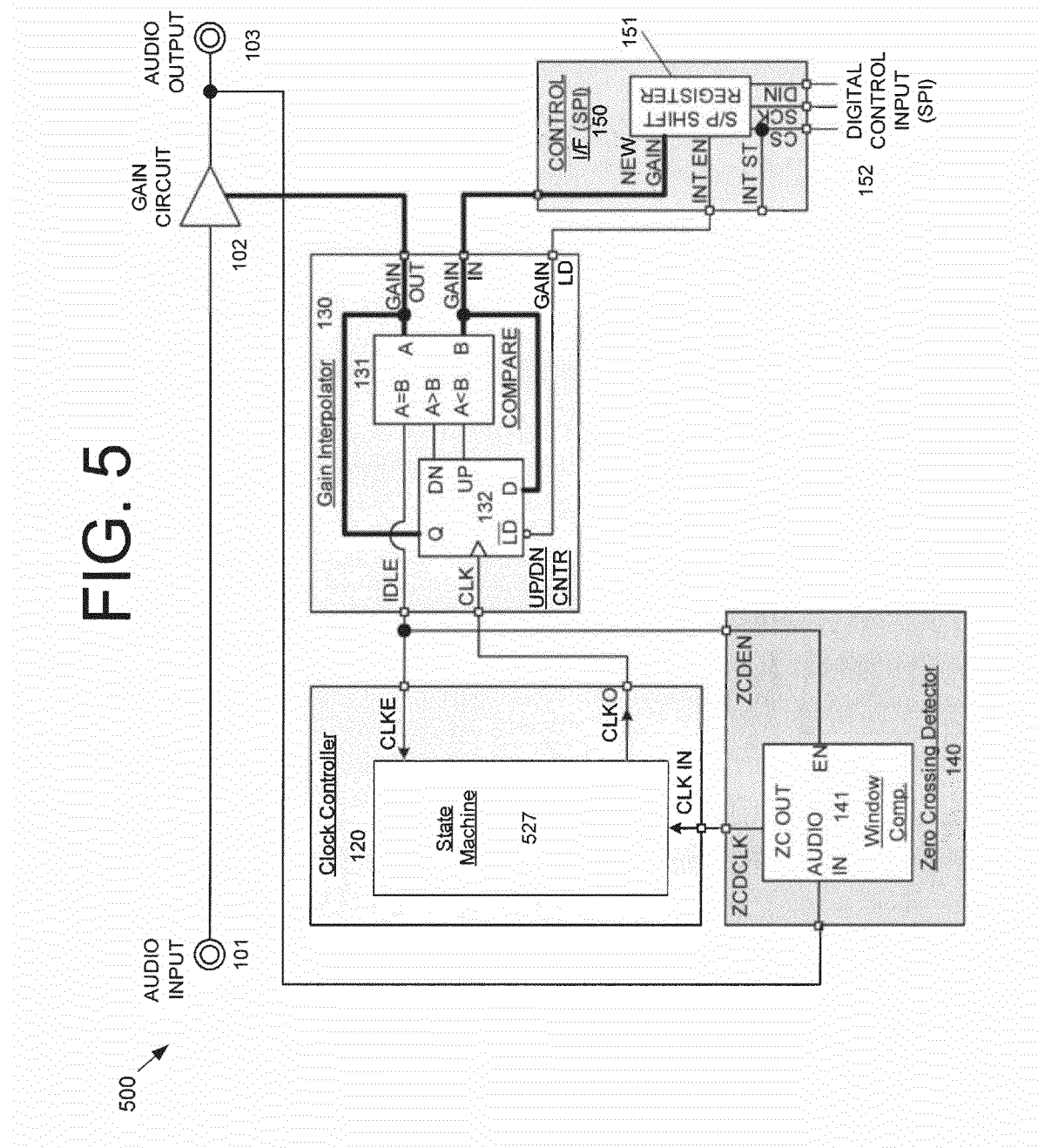
FIG. 5 depicts a gain control system/method, utilizing a state machine, for interpolating amplifier gain, in accordance with an alternate embodiment of the present disclosure.

FIG. 5 depicts a interpolating gain control system 500 utilizing a state machine, for interpolating digitally-controlled amplifier gain, in accordance with an alternate embodiment of the present disclosure. A central feature of embodiments according to FIG. 5 is a timeout period occurs (a selected waiting period) THEN a zero crossing is sought for each ramp step. This causes the ramp to move slower, which might be beneficial (a really fast ramp is not much of a ramp anymore and thus loses its value). Because of this dynamic, such embodiments can be referred to as "Delayed Zero Crossing" embodiments.

System 500 functions similarly to system 100 of FIG. 1; features/elements depicted in FIG. 5 that are common to FIG. 1 are denoted by like numbers (which are described above for FIG. 1). The main difference is the different configuration of clock controller 120, which in this case includes state machine 507.

Figure 6:
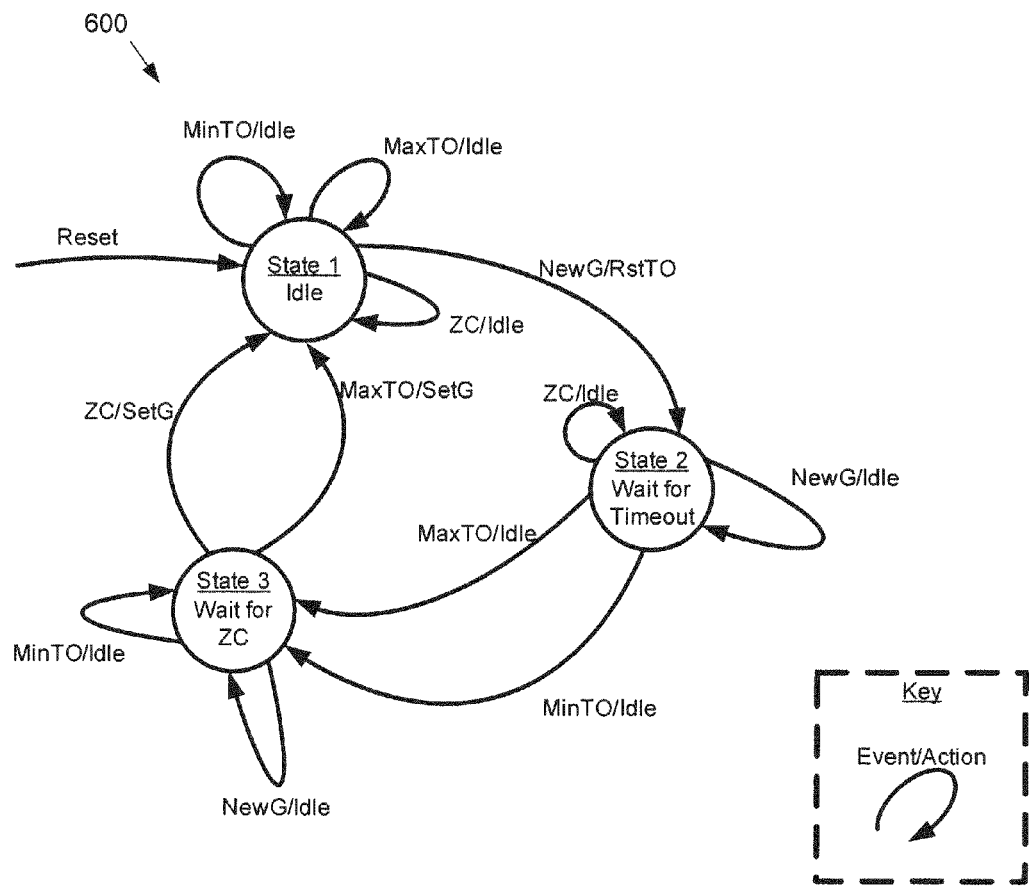
FIG. 6 depicts a state diagram of the state machine of FIG. 5.

In operation, the clock controller 120, with state machine 507, waits a minimum time out (minTO) time after each ramp step before gating through a zero crossing clock to the interpolator. If a maxTO occurs (equivalent to the TRCCLK time out function of FIG. 1), this causes a clock to be sent to the interpolator in the absence of a ZC. This operation is also depicted in FIG. 6. by bubble diagram 600.

As shown in FIG. 1, embodiments of the present disclosure can optionally include a clock randomizer 114 that is configured to convert a periodic clock (pulse train) received from clock controller 120 to a more non-uniform (or, noisy) clocking signal, thereby effectively randomizing the rate of the gain changes made by a gain interpolator, e.g., Gain Interpolator 130 of FIG. 1.

Figure 7:
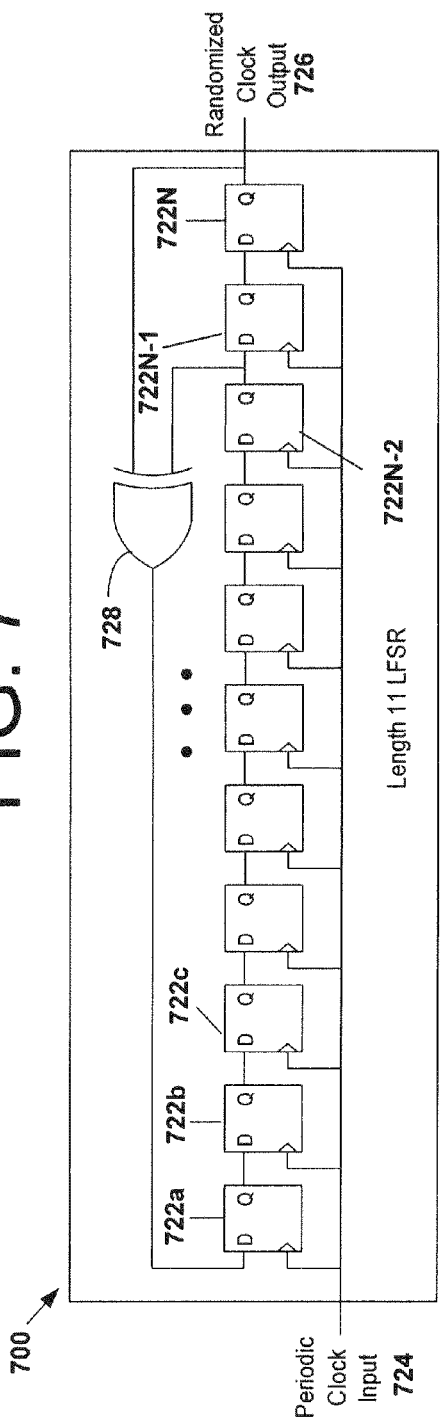
FIG. 7 depicts a clock randomizer including a linear feedback shift register (LFSR) useful in providing a pseudo-random clock signal, in accordance with exemplary embodiments.

For example, a clock randomizer, described in more detail in the Pending Application and shown in greater detail at 700 in FIG. 7, can include a linear feedback shift register (LFSR) including a plurality of registers 722, configured so as to "throw away" clock pulses in a periodic pulse stream, applied at the input 724 so that the output at 726 appears as a pseudo-random clock output at 726. An LFSR is a shift register whose input bit is a function of its previous state. By carefully selecting the taps taken from the shift register, applying them to an exclusive OR function (provided by XOR gate 728), and feeding the output of the XOR gate 728 to the input 724 of the shift register, the LFSR can generate a long sequence of bits that appear random. If the transitions from a 0 to 1 (or, 1 to 0) state are used as clock edges, this pseudo-random sequence will function as a "random clock". The advantage of this approach is that the periodic pulse stream "reference clock" can be generated by any clock source in the system (e.g., synchronous to other system clocks in order to minimize "beating" in the system noise floor), or can even be a series of pulses from a zero crossing detector.

With additional reference to FIG. 1, in a typical gain change event, the gain interpolator 130 has an initial setting (for example, 20 dB). A new gain setting is provided at the digital control input (GAIN IN), causing counter 132 to step through a sequence of intermediate values on their way to the new gain setting (e.g., 1 dB steps toward a new value of 60 dB). For embodiments utilizing a pseudo-randomized clock, each of these intermediate gain steps is executed on the rising or falling edge of the clock signal output by the clock randomizer 114. Therefore, the gain changes are made at a non-uniform rate, and any signal discontinuities can be less discernable, e.g., sound more like a small short term noise burst than a buzz for the case where the amplified analog signal is provided to an audio speaker.

Figure 8:
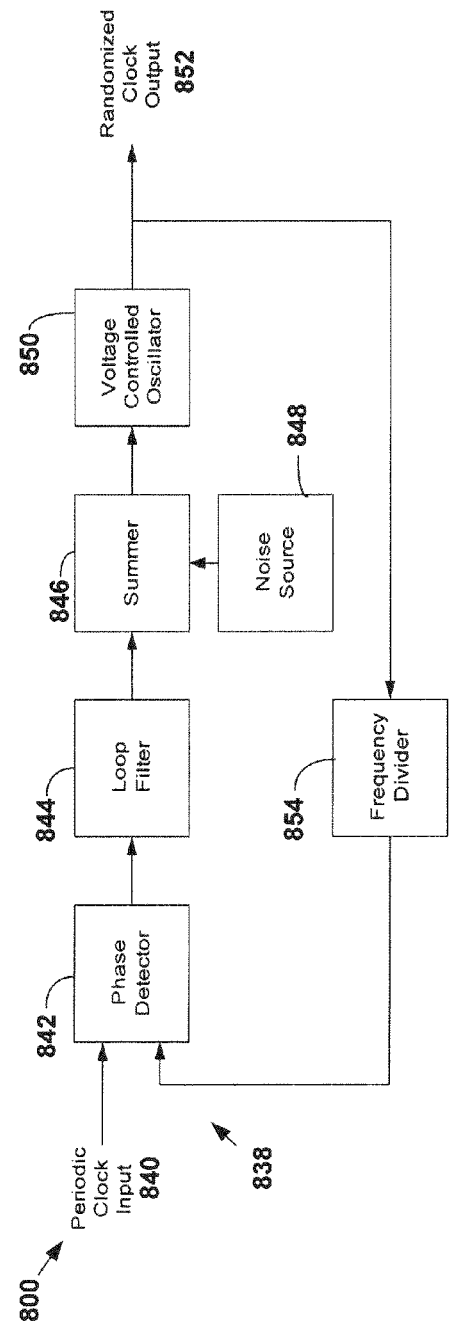
FIG. 8 shows an alternative embodiment of a clock randomizer using a noisy phase locked loop.

FIG. 8 shows alternative embodiment of a clock randomizer, also described in more detail in the Pending Application, is shown in greater detail at 800 in FIG. 8 The clock randomizer 800 includes a noisy phase locked loop. In FIG. 8, the periodic clock input 840 to the PLL 838 is applied to one input of the phase detector 842. The output of the detector 842 is applied to a loop filter 844. The output of the latter is applied to a signal summer 846, which adds to the signal from loop filter 844 a noisy signal received from the noise source 848. The summed signal is then applied to a voltage controlled oscillator (VCO) 850, which in turn provides an output 852. The output is provided in a feedback path to a frequency divider 854, which in turn provides its output to the second input of the phase detector 842. In a typical phase locked loop (PLL) configuration, the PLL provides an output clock signal that tracks the input clock signal. Adding noise to the input of the voltage-controlled oscillator (VCO) 850 induces jitter (randomization) to the output clock signal, and therefore makes the clocking signal more random. Since the timing of the edges of the output clock signal determines when gain changes occur, the jittery clock output at 852 causes the gain changes to occur at randomly varying times Accordingly embodiments of the present disclosure can provide improvements and/or advantages over previous techniques. For example, embodiments can provide for interpolating gain steps, which can reduce unwanted audible effects. Exemplary embodiments of the present disclosure can utilize a microphone preamplifier, which is inherently an amplifier as opposed to an attenuator. Furthermore, embodiments of the present disclosure can allow the ramp (interpolator) to be clocked by audio zero crossings which are inherently non-deterministic. Additionally, embodiments of the present disclosure can allow gain changes to be constrained to zero-crossings, reducing unwanted audible effects. Moreover, embodiments of the present disclosure can provide that a zero crossing detector is enabled when a new gain value is loaded (whether or not initial and new gains match) and disabled after a predetermined finite number of clock cycles.

In addition, embodiments of the present disclosure can provide digitally controlled gain circuits with on-board facility to interpolate intermediate gain steps during large gain changes. Gain interpolators according to the present disclosure can be optionally clocked by, e.g., zero-crossings, oscillators (e.g., an RC oscillator), or delayed zero crossings. Techniques of the present disclosure to interpolate preamplifier gain can also be applied to other parameters such as filter values, audio balance/pan controls, and the like. Additionally, as was noted above, embodiments of the present invention can utilize randomized (or pseudo-randomized) ramping of gain steps for further mitigation of deleterious signal effects on the amplified analog signal.

One skilled in the art will appreciate that other embodiments, beyond those expressly described herein, are within the scope of the present disclosure. For example, while gain interpolators have been described herein as utilizing a clock controller having various configurations, a general or specific purpose oscillator can be utilized in other embodiments. In exemplary embodiments, a voltage controlled oscillator (VCO) may be utilized to send pulses to the gain interpolator.

One skilled in the art will appreciate that embodiments and/or portions of embodiments of the present disclosure can be implemented in/with computer-readable storage media (e.g., hardware, software, firmware, or any combinations of such), and can be distributed over one or more networks. Steps or operations (or portions of such) as described herein, including processing functions to derive, learn, or calculate formula and/or mathematical models utilized and/or produced by the embodiments of the present disclosure, can be processed by one or more suitable processors, e.g., central processing units ("CPUs) or the like implementing suitable code/instructions in any suitable language (machine dependent on machine independent).

The components, steps, features, benefits, and advantages which have been discussed are merely illustrative. None of them, nor the discussions relating to them, are intended to limit the scope of protection in any way. Numerous other embodiments are also contemplated. These include embodiments which have fewer, additional, and/or different components, steps, features, objects, benefits and advantages. These also include embodiments in which the components and/or steps are arranged and/or ordered differently.

Unless otherwise stated, all measurements, values, ratings, positions, magnitudes, sizes, and other specifications which are set forth in this specification, including in the claims which follow, are approximate, not exact. They are intended to have a reasonable range which is consistent with the functions to which they relate and with what is customary in the art to which they pertain. All articles, patents, patent applications, and other publications which have been cited in this disclosure are hereby incorporated herein by reference.

The phrase "means for" when used in a claim is intended to and should be interpreted to embrace the corresponding structures and materials which have been described and their equivalents. Similarly, the phrase "step for" when used in a claim is intended to and should be interpreted to embrace the corresponding acts which have been described and their equivalents. The absence of these phrases in a claim mean that the claim is not intended to and should not be interpreted to be limited to any of the corresponding structures, materials, or acts or to their equivalents. One skilled in the art will appreciate that the subject matter of the following dependent claims can be added together in any combination and added to one or more of the base claims.

Nothing which has been stated or illustrated is intended or should be interpreted to cause a dedication of any component, step, feature, object, benefit, advantage, or equivalent to the public, regardless of whether it is recited in the claims. The scope of protection is limited solely by the claims which now follow. That scope is intended and should be interpreted to be as broad as is consistent with the ordinary meaning of the language which is used in the claims when interpreted in light of this specification and the prosecution history which follows and to encompass all structural and functional equivalents.

What is claimed is:

1. A digitally controlled gain control system for digitally controlling the gain of an amplifier receiving an analog input signal, the system comprising:

an amplifier configured to amplify an analog input signal in accordance with a gain level represented by a digital gain control signal applied to the system; and
a clock controller configured to generate a clocking signal so that the gain level is set in a plurality of increments of gain change in response to the clocking signal;
a zero crossing detector configured to detect when the input signal from the amplifier is within a selected range of zero amplitude; and
a gain interpolator configured to provide a gain control signal to the amplifier, wherein the gain interpolator includes a binary up/down counter that is configured to count between an initial gain value and a new gain value;
wherein each of the plurality of increments of gain change is provided while the input signal is within the selected range of zero amplitude;
wherein the clock controller is configured to pass zero crossing pulses from the zero crossing detector to the gain interpolator, wherein the zero crossing pulses indicate when the input signal from the amplifier is within a selected range of zero amplitude.

2. The system of claim 1, wherein the amplifier supports a plurality of discrete gain settings.

3. The system of claim 1, wherein the amplifier is an audio preamplifier.

4. The system of claim 1, wherein the clock controller is further configured to pass a time-out pulse to the amplifier.

5. The system of claim 1, wherein the gain interpolator comprises a counter configured to adjust a count by an integer value, N.

6. The system of claim 1, further comprising a control interface configured to provide control of the system to a host controller.

7. The system of claim 6, wherein the control interface comprises a shift register configured as a serial to parallel shift register.

8. The system of claim 6, wherein the gain interpolator comprises a comparator and is configured to receive a gain value from the control interface.

9. A digital gain control system for digitally controlling the gain of an amplifier receiving an analog input signal and producing an analog output signal, the system comprising:

a gain interpolator configured to provide a digital gain control signal to an amplifier, wherein the gain interpolator includes a binary up/down counter that is configured to count between an initial gain value and a new gain value;
a clock controller configured to generate a clocking signal so that the gain control signal is set in a plurality of increments of gain change in response to the clocking signal;
a zero crossing detector configured to detect when the input signal from the amplifier is within a selected range of zero amplitude; and
a control interface configured to receive a gain value signal and provide the gain value signal to the zero crossing detector and the gain interpolator;
wherein the clock controller is configured to pass zero crossing pulses from the zero crossing detector to the gain interpolator, wherein the zero crossing pulses indicate when the input signal from the amplifier is within a selected range of zero amplitude;
wherein each of the plurality of increments of gain change is provided while the input signal is within the selected range of zero amplitude.

10. The system of claim 9, further comprising an amplifier configured to amplify an analog input signal in accordance with a gain level represented by the digital gain control signal provided by the gain interpolator.

11. The system of claim 10, wherein the amplifier supports a plurality of discrete gain settings.

12. The system of claim 10, wherein the amplifier is an audio preamplifier.

13. The system of claim 9, wherein the clock controller is further configured to pass a time-out pulse to the amplifier.

14. The system of claim 9, wherein the gain interpolator comprises a counter configured to adjust a count by an integer value, N.

15. A digital gain control system for digitally controlling the gain of an amplifier receiving an analog input signal and producing an analog output signal, the system comprising:
    a gain interpolator configured to provide a digital gain control signal to an amplifier, wherein the gain interpolator includes a binary up/down counter that is configured to count between an initial gain value and a new gain value;
    an amplifier configured to amplify an analog input signal in accordance with a gain level represented by the digital gain control signal provided by the gain interpolator;
    an oscillator configured to generate a clocking signal so that the gain control signal is set in a plurality of increments of gain change in response to the clocking signal;
    a zero crossing detector configured to detect when the input signal from the amplifier is within a selected range of zero amplitude; and
    a control interface configured to receive a gain value signal and provide the gain value signal to the zero crossing detector and the gain interpolator;
    wherein the oscillator is configured to pass zero crossing pulses from the zero crossing detector to the gain interpolator, wherein the zero crossing pulses indicate when the input signal from the amplifier is within a selected range of zero amplitude;
    wherein each of the plurality of increments of gain change is provided while the input signal is within the selected range of zero amplitude.

16. The system of claim 15, further comprising a substrate, and wherein the system is disposed in an integrated circuit (IC) disposed on the substrate.

17. The system of claim 15, wherein the oscillator comprises a voltage controller oscillator (VCO).

18. A digitally controlled gain control system for digitally controlling the gain of an amplifier receiving an analog input signal, the system comprising:
    an amplifier configured to amplify an analog input signal in accordance with a gain level represented by a digital gain control signal applied to the system; and
    a clock controller configured to generate a clocking signal so that the gain is set in a plurality of increments of gain change in response to the clocking signal, wherein the clock controller includes a randomizer configured to randomize the clock signal;
    wherein the clock controller passes zero crossing pulses from the zero crossing detector to the amplifier, wherein the zero crossing pulses indicate when the input signal from the amplifier is within a selected range of zero amplitude;
    wherein each of the plurality of increments of gain change is provided in a non-uniform time increment relative to the other increments of gain change.

19. The system of claim 18, further comprising a zero crossing detector configured to detect when the input signal from the amplifier is within a selected range of zero amplitude; and
    wherein the increments of gain change are provided in one or more increments while the input signal is within the selected range of zero amplitude.

20. A digital gain control system for digitally controlling the gain of an amplifier receiving an analog input signal and producing an analog output signal, the system comprising:
    a gain interpolator configured to provide a digital gain control signal to an amplifier, wherein the gain interpolator includes a binary up/down counter that is configured to count between an initial gain value and a new gain value;
    a clock controller configured to generate a clocking signal so that the gain control signal is set in a plurality of increments of gain change in response to the clocking signal;
    a zero crossing detector configured to detect when the input signal from the amplifier is within a selected range of zero amplitude; and
    a control interface configured to receive a gain value signal and provide the gain value signal to the zero crossing detector and the gain interpolator;
    wherein the clock controller is configured to pass zero crossing pulses from the zero crossing detector to the gain interpolator, wherein the zero crossing pulses indicate when the input signal from the amplifier is within a selected range of zero amplitude;
    wherein each of the plurality of increments of gain change is provided after a selected waiting period and while the input signal is within the selected range of zero amplitude.

21. The system of claim 20, further comprising an amplifier configured to amplify an analog input signal in accordance with a gain level represented by the digital gain control signal provided by the gain interpolator.

22. A method of digitally controlling the gain of an amplifier, comprising:
    amplifying an analog input signal in accordance with a gain represented by a digital gain control signal;
    generating a clocking signal so that the gain is set in a plurality of increments of gain change in response to a change in the gain represented by a respective change in the digital gain control signal;
    detecting when the input signal from the amplifier is within a selected range of zero amplitude; and
    applying each of the plurality of increments of gain change to the input signal when the input signal is within the selected range of zero amplitude;
    wherein generating a clocking signal is performed by a clock controller that is configured to pass zero crossing pulses from a zero crossing detector to a gain interpolator, wherein the zero crossing pulses indicate when the input signal from the amplifier is within a selected range of zero amplitude.

23. The method of claim 22, wherein the increments of gain change are provided in one or more increments after a selected waiting period.

24. The method of claim 22, wherein the amplifier supports a plurality of discrete gain settings each presented by a different digital gain control signal.

25. A method of digitally controlling the gain of an amplifier, comprising:
    amplifying an analog input signal in accordance with a gain represented by a digital gain control signal; and
    generating a clocking signal so that the gain can be set in increments of gain change in response to a change in the gain represented by a respective change in the digital gain control signal, wherein generating the clocking signal includes generating the clocking signal in non-uniform time increments that vary pseudo-randomly, producing a pseudo-randomized clock signal.

26. The method of claim 25, further comprising generating a periodic clock signal and generating a pseudo-randomized clock signal in response to the periodic clock signal.

27. The method of claim 25, wherein generating a pseudo-randomized clock signal includes processing the periodic clock signal with a linear feedback shift register (LFSR).

28. The method of claim 25, wherein generating a pseudo-randomized clock signal includes processing the periodic clock signal with a phase lock loop.

* * * * *